US009225285B2

(12) United States Patent
Peurach et al.

(10) Patent No.: US 9,225,285 B2
(45) Date of Patent: Dec. 29, 2015

(54) PHOTOVOLTAIC INSTALLATION WITH AUTOMATIC DISCONNECT DEVICE

(75) Inventors: John Peurach, San Francisco, CA (US); Carl J. S. Lenox, Oakland, CA (US); Jawid Arghestani, Pleasanton, CA (US)

(73) Assignee: SunPower Corporation, San Jose, CA (US)

( * ) Notice: Subject to any disclaimer, the term of this patent is extended or adjusted under 35 U.S.C. 154(b) by 1225 days.

(21) Appl. No.: 12/371,315

(22) Filed: Feb. 13, 2009

(65) Prior Publication Data

US 2010/0071744 A1    Mar. 25, 2010

Related U.S. Application Data

(60) Provisional application No. 61/099,662, filed on Sep. 24, 2008.

(51) Int. Cl.

| H01L 31/042 | (2014.01) |
| H02N 6/00 | (2006.01) |
| H02S 40/30 | (2014.01) |
| H01L 31/02 | (2006.01) |
| H02S 40/34 | (2014.01) |
| H01L 31/075 | (2012.01) |

(Continued)

(52) U.S. Cl.
CPC .......... *H02S 40/30* (2014.12); *H01L 31/02019* (2013.01); *H01L 31/02021* (2013.01); *H01L 31/075* (2013.01); *H01L 31/076* (2013.01); *H01L 31/1876* (2013.01); *H02S 40/34* (2014.12); *Y02B 10/12* (2013.01); *Y02B 10/14* (2013.01); *Y02E 10/548* (2013.01); *Y02E 10/56* (2013.01); *Y02E 10/563* (2013.01); *Y02E 10/566* (2013.01)

(58) Field of Classification Search
CPC ............ H01L 31/02021; H01L 31/075; H01L 31/076; H01L 31/1876; Y02E 10/548; Y02E 10/566; Y02E 10/56; Y02E 10/563; Y02B 10/12; Y02B 10/14; H02S 40/30; H02S 40/34
USPC ................................. 136/243–265, 290, 293
See application file for complete search history.

(56) References Cited

U.S. PATENT DOCUMENTS

2002/0014262 A1* 2/2002 Matsushita et al. ........... 136/244
2002/0171475 A1* 11/2002 Picha et al. ..................... 330/10
(Continued)

OTHER PUBLICATIONS

Electricity at 32 kHz; Welter, Phillippe et al.; Photon International; Aug. 2007; pp. 110-111.
(Continued)

*Primary Examiner* — Jonathan Johnson
*Assistant Examiner* — Lindsey Bernier
(74) *Attorney, Agent, or Firm* — Okamoto & Benedicto LLP

(57) ABSTRACT

A PV installation comprises a PV array, an electrical interface connecting a utility power source to an electrical load, and a DC to AC inverter. A first set of wiring electrically connects the PV array to the inverter through a disconnect device and a second set of wiring electrically connects the inverter to the electrical interface. A control mechanism connects the disconnect device to the electrical interface so that when power from the electrical interface is removed, the PV array is electrically disconnected from the inverter. The disconnect device may be a remote disconnect device located at a position at or near the PV array, such as in the space beneath a roof supporting the PV array. A method electrically disconnects a PV array from electrical wiring at a site.

11 Claims, 3 Drawing Sheets

(51) Int. Cl.
*H01L 31/076* (2012.01)
*H01L 31/18* (2006.01)

(56) References Cited

U.S. PATENT DOCUMENTS

| | | | |
|---|---|---|---|
| 2003/0047209 A1* | 3/2003 | Yanai et al. | 136/291 |
| 2004/0232878 A1* | 11/2004 | Couch et al. | 320/101 |
| 2006/0162772 A1* | 7/2006 | Presher et al. | 136/290 |
| 2007/0135970 A1* | 6/2007 | Zhou et al. | 700/286 |

OTHER PUBLICATIONS

Disco Madness, The Whys & Wheres of Disconnects; Wiles, John; www.homepower.com; homepower 119 / Jun. & Jul. 2007; pp. 104-106.

Product description for "PV Disconnect Switch" manufactured by "Square D", downloaded from internet Feb. 13, 2009; 1 pp.

\* cited by examiner

PHOTOVOLTAIC INSTALLATION WITH AUTOMATIC DISCONNECT DEVICE

BACKGROUND OF THE INVENTION

This invention relates to enhancing safety at a site, such as a home or a commercial building, which obtains power from both (1) a photovoltaic (PV) power source, and (2) another power source, typically a utility power source.

Fire departments typically shut off the main disconnect at the electrical panel when responding to a fire to ensure that all electrical circuitry within a building is deactivated. However, PV panels, typically located on the roof of the building, are energized whenever light shines on them. Therefore, during daylight hours the DC PV circuitry from the PV panels to the inverter and any other control electronics, which may be run inside and/or outside the building, remains electrically energized even when the AC circuitry has been deenergized, such as when the main disconnect has been shut off. Therefore, fire departments often require an external disconnect switch adjacent to the PV panels, typically on the roof, to allow fire department personnel to deactivate all circuits in the building from any power supplied by PV panels.

BRIEF SUMMARY OF THE INVENTION

An example of a photovoltaic (PV) installation at a site comprises a PV array including PV panels, an electrical interface connecting a utility power source to an electrical load at the site, and a DC to AC inverter. The installation also includes a first set of wiring electrically connecting the PV array to the DC to AC inverter, a second set of wiring electrically connecting the DC to AC inverter to the electrical interface, and a disconnect device. The first set of wiring electrically connects the PV array to the inverter through the disconnect device. The installation further includes a control mechanism connecting the disconnect device to the electrical interface so as to be operable in response to the removal of power from the electrical interface so as to electrically disconnect the PV array from the inverter. In some examples the disconnect device is a remote disconnect device located at a position at or near the PV array. In some examples the remote disconnect device is mounted in the space beneath the roof supporting the PV array.

An example of a method for electrically disconnecting a photovoltaic (PV) array from electrical wiring at a site is carried out as follows. The PV array at the site provides power to a set of electrical wiring connecting to an inverter, the site comprising an electrical load connected to a utility power source and to the inverter through an electrical interface. Removal of power from the power source to the electrical interface is sensed. The state of a disconnect device is changed in response to the sensing of the removal of power from the power source to the electrical interface. The PV array is electrically disconnected from the electrical wiring at the site by the disconnect device in response to the sensing of the removal of power from the power source to the electrical interface. In some examples the changing the state step is carried out with the disconnect device being a remote disconnect device located at a position at or near the PV array, and the changing step comprises modifying the state of a control mechanism of the remote disconnect device.

Other features, aspects and advantages of the present invention can be seen on review of the figures, the detailed description, and the claims which follow.

DESCRIPTION OF THE SPECIFIC EMBODIMENTS

Figure 1:
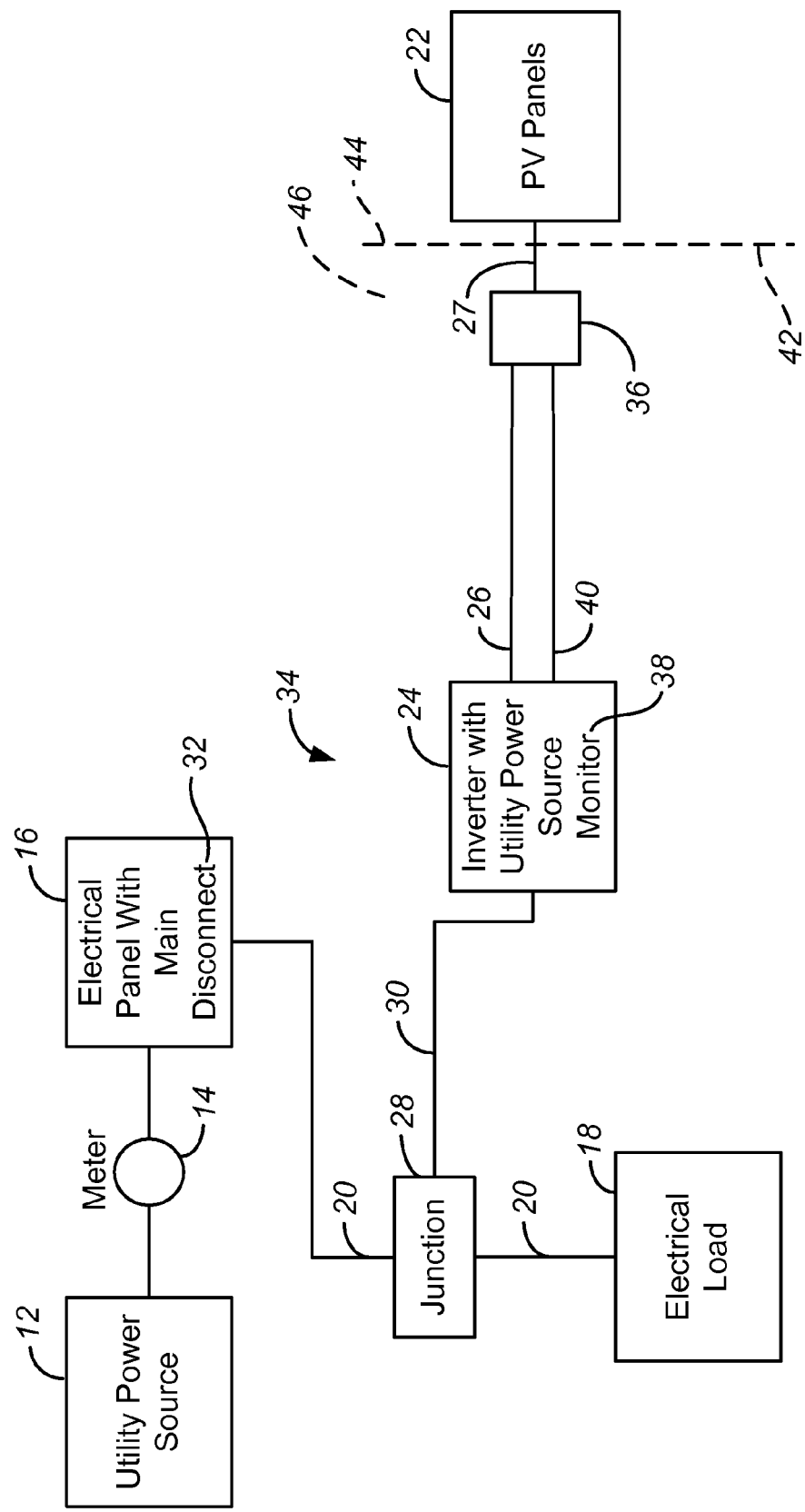
FIG. 1 is a schematic diagram of a PV installation including a remote disconnect device.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

An aspect of the invention relates to the recognition that rooftop mounted disconnect switches have several disadvantages. They tend to be aesthetically displeasing, in particular with building-integrated PV arrays which are designed to blend in with the building envelope. Placing the disconnect switch on the roof typically requires a firefighter to get on the roof to manually operate the switch before entering the building; this is often a safety risk and increases the response time to begin actively dealing with the fire or other emergency. Also, disconnect switches exposed to the environment are susceptible to corrosion, which may impair their proper operation after a period of time.

Another aspect of the invention is the recognition that it would be extremely useful to remotely and transparently electrically disconnect PV panels and thus the array from the electrical circuits of the building whenever electricity to the electrical panel is removed, such as by the use of the main disconnect at the electrical panel or otherwise. This can be accomplished through the use of a remote disconnect positioned at or near the PV panels, such as within the attic space adjacent to the roof supporting a typical PV array.

FIG. 1 illustrates a simplified block diagram of a PV installation or system 10 including a power source 12 connected to an electric consumption meter 14 at a site, such as an individual house, a commercial building, or other location at which solar electric power is generated. Although power source 12 is typically a utility power source, it could also be a local power source such as a fossil fuel powered generator. Meter 14 is typically connected to an electrical panel 16. Electrical power is supplied from electrical panel 16 to the electrical load 18 at the site by electrical conductor 20. Photovoltaic (PV) array 22 is connected to a DC to AC inverter 24 by PV power lines 26, 27 with inverter 24 connected to a junction 28 along electrical conductor 20 by a line 30. Junction 28 acts as an electrical interface for power from utility power source 12 and PV array 22. Electrical panel 16 may include a main disconnect 32 used to interrupt all power from power source 12 from flowing through the electrical panel 16, through conductor 20 and to electrical load 18 at the site. The main disconnect 32 may also be an independent device from electrical panel 16. The on-site electrical wiring 34 includes conductor 20, inverter 24, PV power line 26, junction 28 and line 30. The above described structure is generally conventional.

System 10 also includes a remote disconnect device 36 located between PV power lines 26, 27. During normal operation device 36 permits power to flow through PV power lines 26, 27. However, when the electrical power to electrical panel 16, and thus to conductor 20, is disrupted, typically by the operation of main disconnect 32 or by a loss of power from power source 12, power source monitor 38 causes the state of a control mechanism 40 to change so to operate the remote disconnect device 36 creating an open circuit between PV power lines 26, 27 so that the PV array 22 no longer provides electricity to electrical wiring 34. In this way, firefighters or other personnel are no longer subjected to live wires within electrical wiring 34. Doing so can also help reduce or eliminate any problems that may be created or exacerbated by PV array 22 sending power into electrical wiring 34. In the disclosed embodiment control mechanism 40 comprises a conductor coupling a utility power source monitor 38, which senses when power to electrical panel 16 is disrupted, to remote disconnect device 36. However, other types of control mechanisms, including wireless radio communication and optical connections, could also be used. The change of state on the control mechanism 40 using a conductor can be provided as, for example, a pulsed voltage or a ramped voltage, or it can be provided by dropping the voltage of a conductor to zero.

In the embodiment of FIG. 1, a utility power source monitor 38 is shown as a part of inverter 24. However, monitor 38 could be a separate component monitoring for a loss of power to electrical panel 16; for example, monitor 38 could be designed as a part of electrical panel 16 or as a component along conductor 20. Also, the components constituting monitor 38 could be split up and located at different positions, such as at inverter 24 and at electrical panel 16. In another embodiment, the disconnect device 36 is connected directly to junction 28 or to conductor 20 or to electrical panel 16 so that it directly senses the loss of power to electrical panel 16.

Although remote disconnect device 36 can be located on top of roof 44 at or near PV array 22, it is preferred that device 36 be located in a protected space. Preferably, remote disconnect device 36 is located adjacent to the underside 42 of the roof 44, typically within the attic or other space 46 beneath the roof, to which PV array 22 is mounted in order to maximize the length of de-energized wiring. This positioning at or near the underside 42 of roof 44 closest to PV array 22 both helps to protect device 36 from the elements while also ensuring that virtually all of electrical wiring 34 is de-energized when power from power source 12 is disconnected.

Figure 2:
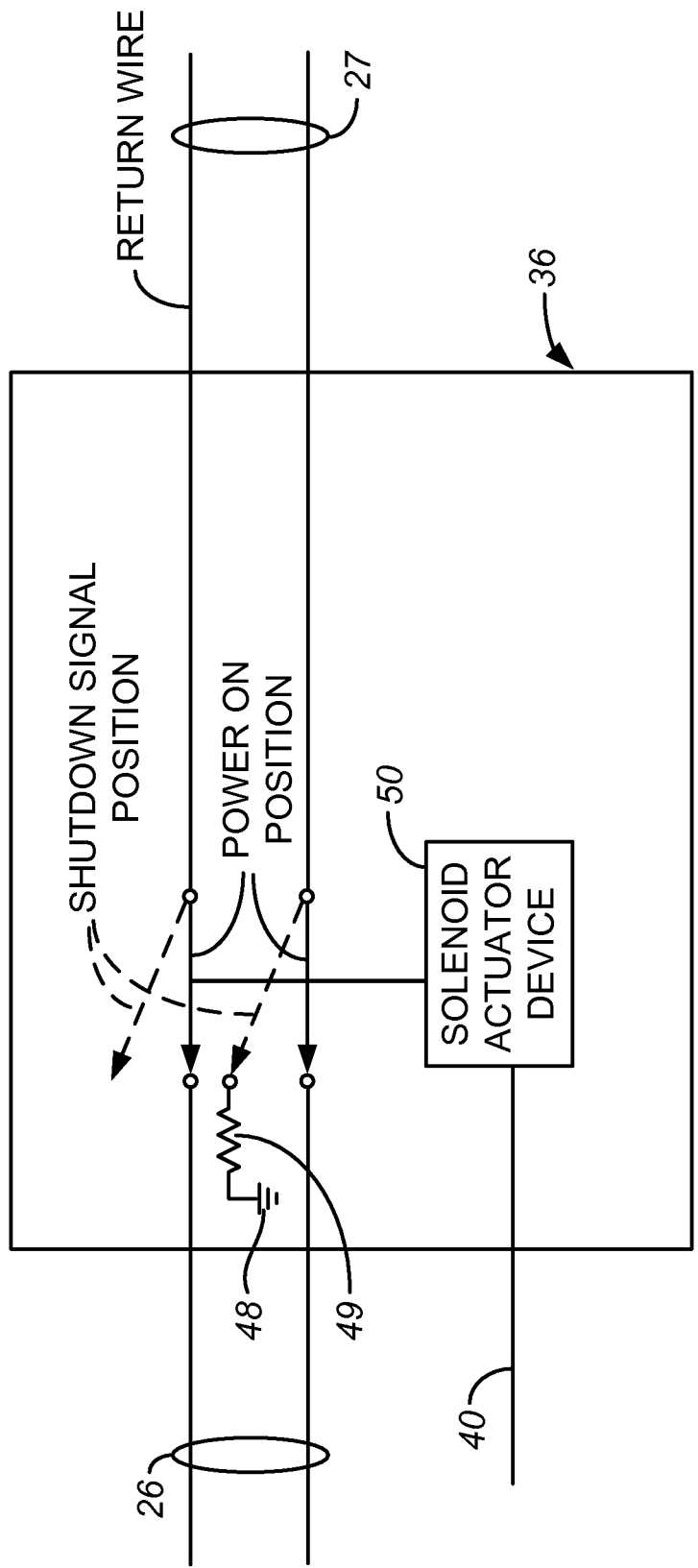
FIG. 2 is a simplified drawing of a remote disconnect device.

Remote disconnect device 36 is shown in FIG. 2 to include a contactor device 50 that maintains the power on position only when a voltage is applied through the control mechanism 40; dropping the voltage on the control mechanism 40 to a zero voltage state causes the contactor device 50 to assume the shutdown position of FIG. 2. In this way, remote disconnect device 36 operates in a fail safe manner. In the shutdown position, the PV array 22 by way of a power line 27 is connected to earth ground 48 through a resistor 49. Instead of using a contactor device 50 with mechanical switches, device 36 could comprise a semiconductor switching device. An advantage of a semiconductor switching device would be that in addition to electrically isolating PV from electrical wiring 34, a semiconductor switching device could use a lower voltage control mechanism. An advantage of a contactor device 50 is that it is typically less sensitive to the elevated temperatures that may be encountered within an attic space compared with the heat sensitivity of typical semiconductor switching devices.

Figure 3:
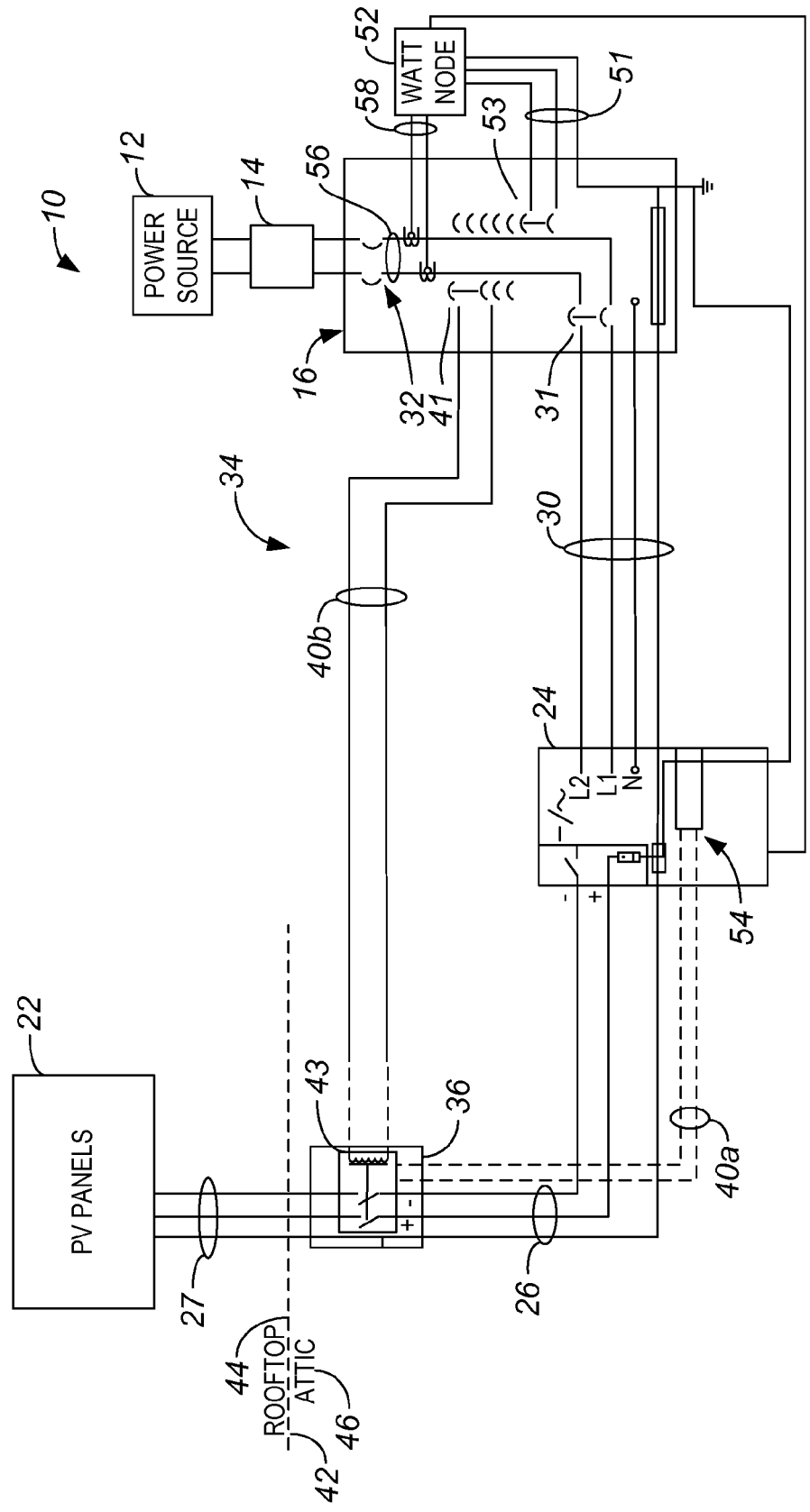
FIG. 3 is a line diagram of an example of a PV installation.

FIG. 3 is a line diagram of an example of system 10 with two alternative ways of providing a shutdown signal to remote disconnect device 36. During normal daylight operations, power can be supplied from power source 12 and PV array 22 to main electrical panel 16, which also includes what is considered junction 28 in FIG. 1. Power from PV array 22 passes through remote disconnect device 36 and through PV power line 26 where it is transformed from direct current to alternating current by inverter 24. The power from PV array 22 then passes from inverter 24 to panel 16 through line 30 and circuit breaker 31 as alternating current. Alternating current then passes from panel 16 to the electrical load through one or more circuit breakers; the load and to the associated circuit breakers are not shown in FIG. 3 for ease of illustration. Power to the on-site electrical wiring 34 from power source 12 can be shut off by operation of main disconnect 32 within panel 16. This shuts off alternating current passing through circuit breaker 41 to direct sensing power source monitor lines 40b powering contactor device 50 and thus opening the circuit between lines 27 and 26.

Inverter 24, which is powered by electricity from electrical panel 16, automatically shuts down when power from electrical panel 16 to inverter 24 is cut off, as is conventional. It was recognized that this attribute of conventional inverters can be utilized by powering the contactor device 50 within remote disconnect device 36 with a DC signal from an integrated power source monitor 54 in inverter 24 through integrated control lines 40a. Doing so would mean that the voltage along integrated control lines 40a could be a more benign direct current, typically 20 V DC, as opposed to a potentially more hazardous 120 V AC current typically used along lines 40b.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, remote disconnect device 36 could be used between a battery, not shown, and inverter 24 so as to be operable in response to the removal of power along conductor 20 so as to disconnect the battery from the inverter.

Any and all patents, patent applications and printed publications referred to above are incorporated by reference.

What is claimed is:

1. A photovoltaic (PV) installation at a site comprising:
   a PV array comprising PV panels;
   an electrical interface connecting a utility power source to an electrical load at the site;
   a DC to AC inverter;
   a first set of wiring electrically connecting the PV array to a switch;
   a second set of wiring electrically connecting the DC to AC inverter to the electrical interface; and
   a remote disconnect device external to the electrical interface, the DC to AC inverter, and the PV array, the remote disconnect device being located between the PV array and the DC to AC inverter, the remote disconnect device comprising the switch, the switch having a first position that electrically connects the first set of wiring to the DC to AC inverter and a second position that electrically connects at least one wiring in the first set of wiring directly to a resistor that connects the PV array to ground, the remote disconnect device being configured to sense a control signal and to disconnect the PV array from the DC to AC inverter at a level of the control signal indicative of removal of power from the electrical interface by placing the switch in the second position.

2. The installation according to claim 1, wherein the remote disconnect device is at a location at or near the PV array.

3. The installation according to claim 2, wherein:
the site comprises a building having a roof and a space directly beneath the roof;
the PV array is mounted to the roof; and
the remote disconnect device is mounted in said space.

4. The installation according to claim 1, wherein the electrical interface comprises a main disconnect by which power from the utility power source can be removed from the electrical interface.

5. The installation according to claim 1, wherein the switch comprises a semiconductor switching device.

6. A photovoltaic (PV) installation at a site comprising:
a PV array comprising PV panels;
an electrical interface connecting an external power source to an electrical load at the site;
a DC to AC inverter;
a disconnect device having a signal line input, a power line input, and a power line output, the disconnect device comprising a switch having a first position that connects the PV array to the DC to AC inverter and a second position that connects the PV array directly to a resistor that connects the PV array to ground, the disconnect device being configured to receive a control signal from the signal line input, the disconnect device being configured to break electrical connection between the power line input and the power line output at a first level of the control signal by placing the switch in the second position, the disconnect device being configured to connect the power line input to the power line output at a second level of the control signal by placing the switch in the first position;
a first set of wiring electrically connecting the PV array to the power line input;
a second set of wiring electrically connecting the DC to AC inverter to the electrical interface; and
a power source monitor having an input electrically coupled to the electrical interface and an output, the power source monitor being configured to sense external power at the electrical interface, the output electrically coupled to the signal line input of the disconnect device, the power source monitor being configured to automatically generate the control signal to be at the first level when the external power is removed from the electrical interface, the power source monitor being configured to automatically generate the control signal to be at the second level at said output when the external power is present at the electrical interface;
whereby the PV array is automatically electrically disconnected from the DC to AC inverter upon removal of external power source power from the electrical interface.

7. The installation according to claim 6, wherein the disconnect device is a remote disconnect device at a location at or near the PV array.

8. The installation according to claim 7, wherein:
the site comprises a building having a roof and a space directly beneath the roof;
the PV array is mounted to the roof; and
the remote disconnect device is mounted in said space.

9. The installation according to claim 6, wherein the electrical interface comprises a main disconnect by which the external power can be removed from the electrical interface.

10. The installation according to claim 6, wherein the switch comprises a semiconductor switching device.

11. A photovoltaic (PV) installation at a site comprising:
a PV array comprising PV panels;
an electrical interface connecting an external power source to an electrical load at the site;
a DC to AC inverter;
a first set of wiring electrically connecting the PV array to the DC to AC inverter;
a second set of wiring electrically connecting the DC to AC inverter to the electrical interface; and
disconnect means for automatically electrically disconnecting the PV array from the DC to AC inverter when a level of a control signal indicates removal of external power source power from the electrical interface, the disconnect means comprising a switch having a first position that connects the PV array to the DC to AC inverter and a second position that connects the PV array directly to a resistor that connects the PV array to ground.

* * * * *